United States Patent
Raja et al.

(10) Patent No.: US 7,138,315 B2
(45) Date of Patent: Nov. 21, 2006

(54) LOW THERMAL RESISTANCE SEMICONDUCTOR DEVICE AND METHOD THEREFOR

(75) Inventors: Narayan Raja, Warwick, RI (US); Roger P. Stout, Chandler, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 0 days.

(21) Appl. No.: 10/964,022

(22) Filed: Oct. 14, 2004

(65) Prior Publication Data

US 2006/0084228 A1 Apr. 20, 2006

(51) Int. Cl.
*H01L 21/336* (2006.01)
*H01L 29/76* (2006.01)

(52) U.S. Cl. .................. 438/268; 438/269; 438/270; 257/401

(58) Field of Classification Search .......... 438/268, 438/269, 270, 271, 274; 257/401, 335, 341, 257/342, 578
See application file for complete search history.

(56) References Cited

U.S. PATENT DOCUMENTS

| 4,898,804 A | 2/1990 | Rauschenbach et al. ..... 430/311 |
| 5,034,785 A | 7/1991 | Blanchard |
| 6,043,532 A * | 3/2000 | Depetro et al. ............. 257/335 |
| 6,060,761 A * | 5/2000 | Kawakita et al. ........... 257/557 |
| 6,204,533 B1 | 3/2001 | Williams et al. |
| 6,541,818 B1 | 4/2003 | Pfirsch et al. |
| 6,768,167 B1 * | 7/2004 | Nagaoka et al. ............ 257/329 |
| 6,905,921 B1 | 6/2005 | Liu et al. .................... 438/197 |
| 2001/0000627 A1 | 5/2001 | Hayakawa et al. ......... 257/347 |
| 2003/0055613 A1 | 3/2003 | Tsai ............................. 703/2 |

* cited by examiner

*Primary Examiner*—Michael Lebentritt
*Assistant Examiner*—Cheung Lee
(74) *Attorney, Agent, or Firm*—Robert F. Hightower

(57) ABSTRACT

A semiconductor device is formed to have a shape that reduces the thermal resistance of the semiconductor device.

18 Claims, 8 Drawing Sheets

LOW THERMAL RESISTANCE SEMICONDUCTOR DEVICE AND METHOD THEREFOR

This application is related to co-pending application Ser. No. 10/964,021 having a common assignee.

BACKGROUND OF THE INVENTION

The present invention relates, in general, to electronics, and more particularly, to methods of forming semiconductor devices and structure.

In the past, the semiconductor industry utilized various methods and structures to form semiconductor devices. Forming power devices usually presented a concern of the maximum power that could be dissipated by the semiconductor device. Typically, the power device was formed as a single fixed area of a semiconductor substrate. FIG. 1 schematically illustrates a general conception of a semiconductor device 200 that had a power device 202 on a semiconductor substrate 201. A top portion of FIG. 1 illustrates a plan view of device 200 while a bottom portion of FIG. 1 illustrates a cross-sectional view along section lines 1—1. Dashed lines illustrate heat that radiated from power device 202 through substrate 201. As can be seen, most of the heat was concentrated in a portion 204 of substrate 201. Portion 204 was referred to as a self-interacting region of heat. Such self-interacting regions of heat typically caused semiconductor device 200 to have a high thermal resistance and reduced the maximum power that device 200 could dissipate. In some cases, the high thermal resistance semiconductor devices required extra cooling to keep the temperature of the semiconductor die below a maximum allowable limit thereby increasing the cost of using the semiconductor device. Because of the high thermal resistance, the temperature of the semiconductor die often increased to a temperature which reduced the reliability and lifetime of the semiconductor device.

Accordingly, it is desirable to have a method that efficiently distributes heat within a semiconductor device, that does not reduce the packing density of the semiconductor device, and that lowers the thermal resistance of the semiconductor device.

For simplicity and clarity of illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-Channel devices, a person of ordinary skill in the art will appreciate that complementary devices are also possible in accordance with the present invention. For clarity of the drawings, doped regions of device structures are illustrated as having generally straight line edges and precise angular corners. However, those skilled in the art understand that due to the diffusion and activation of dopants the edges of doped regions are generally not straight lines and the corners are not precise angles.

DETAILED DESCRIPTION OF THE DRAWINGS

Figure 2:
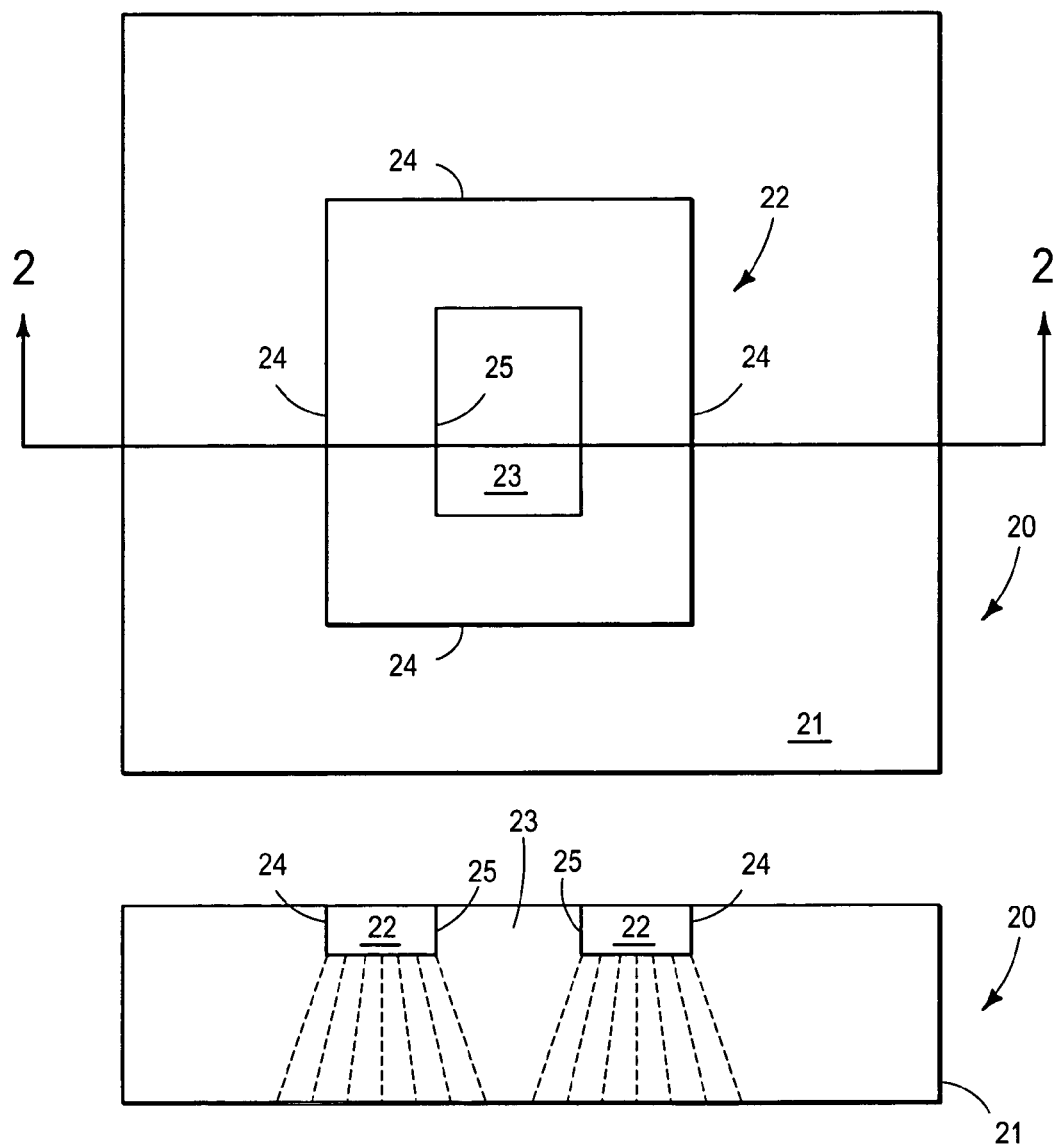
FIG. 2 schematically illustrates a portion of an embodiment of a semiconductor device in accordance with the present invention.

FIG. 2 schematically illustrates a portion of an embodiment of a semiconductor device 20 that is formed on a semiconductor substrate 21. A top portion of FIG. 2 illustrates a plan view of device 20 while a bottom portion of FIG. 2 illustrates a cross-sectional view along section lines 2—2. Device 20 includes a high power dissipating semiconductor device 22 that is formed to have a shape or topology that provides improved thermal distribution for device 20, that minimizes the value of the thermal resistance of device 20, and that maximizes the utilization of the area of semiconductor substrate 21. It has been found that a class of shapes or topologies referred to as "multiply-connected" shapes is one class of shapes that provides the improved thermal distribution. The shape of device 22 illustrated in FIG. 2 is one example of a shape within the class of shapes that are "multiply-connected". The term "multiply-connected" means a connected domain that has holes in it.

Device 22 may be a vertical power metal oxide semiconductor (MOS) transistor, or a lateral MOS power transistor, or a high current diode, or a bipolar transistor. For example, device 22 may be a lateral or vertical LDMOS power transistor. Device 20 may also include other active or passive semiconductor elements that are not shown for simplicity of the drawings. Device 22 is formed in square doughnut shape that is one example of a multiply-connected shape or topology. The square doughnut has a shape or topology on the surface of substrate 21 that is a square-ring with a hole in the middle that exposes a portion 23 of the surface of substrate 21 within the hole. As will be seen hereinafter, high power dissipating portions of device 22 are arranged to form the square-doughnut. Device 22 has outside sides 24 that are arranged to form a perimeter of the shape of device 22. Interior sides 25 form the interior of the doughnut. The area of device 22 is the area occupied between sides 24 and sides 25. For the case where device 22 is a non-cell-based bipolar transistor or a non-cell-based lateral MOS power transistor, sides 24 typically are formed by the exterior sides of doped regions of the current carrying electrodes of device 22 such as the exterior edge of a doped region within substrate 21 that forms the drain region. Typically, such doped regions extend to the surface of substrate 21 and have a shape on the surface. Sides 24 may also be formed as the exterior edges of the doped regions of substrate 21 that form the high power dissipating regions of device 22. For the example of a lateral MOS power transistor, during operation the high power dissipation typically occurs in the channel region between the drain and the source. Since the channel is defined as the region between the source and drain, the edge of the doped region forming the source and facing the drain is one side of the shape, such as side 24, and the edge of the doped region that faces the source is another side of the shape, such as side 25. Thus, one side of the doped regions forming the drain or the source becomes side 24 and another side of that doped region or regions is side 25. The cross-sectional view of device 20 shows that the multiply-connected structure forms device 20 into spaced apart regions of high power dissipation formed by the portions of device 22 between sides 24 and 25. The portions of substrate 21 underlying portion 23 are lower power dissipation areas of substrate 21. Dashed lines illustrate the regions of high heat dissipation that radiates from the doped regions of device 22. Thus, forming device 22 in the shape of a square doughnut distributes the heat out across a greater area of substrate 21, reduces the size of the self-interacting region, and reduces the heat that has to be dissipated at any point of substrate 21 underlying device 22 thereby lowering the thermal resistance of device 20. Portion 23 of substrate 21 and regions of device 20 external to device 22 can be used to form other active and passive elements such as transistor drivers, logic gates, resistors, and other well known elements. Forming other active and passive devices within portion 23 prevents the shape of device 22 from affecting the packing density of device 20.

Figure 1:
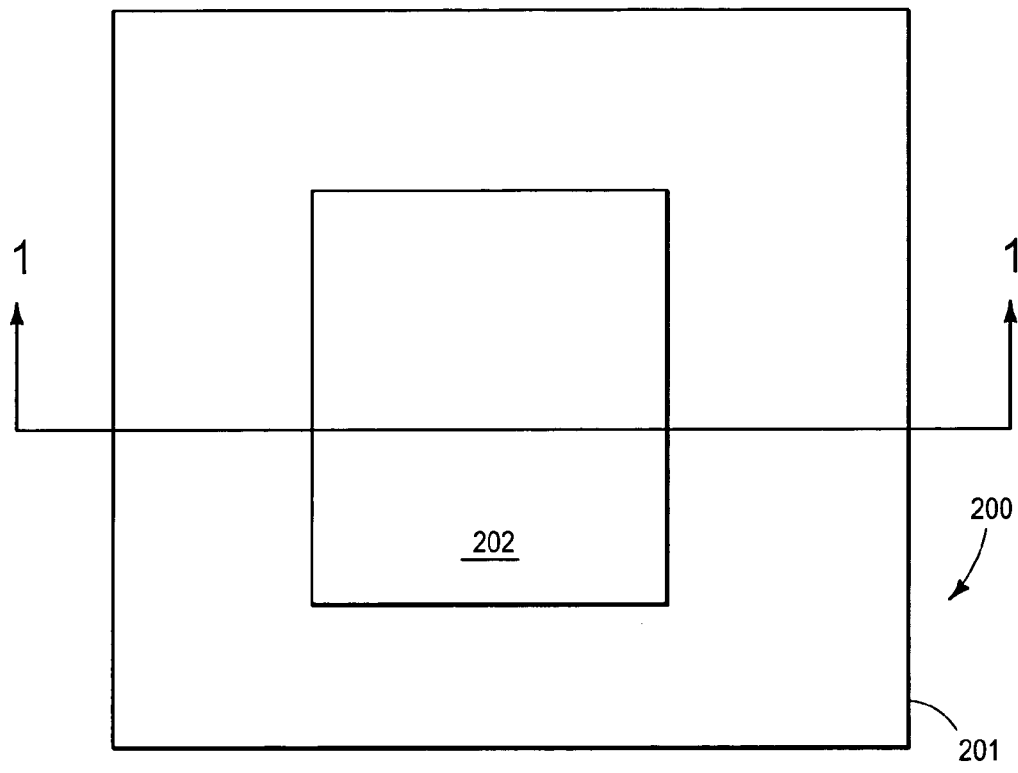
FIG. 1 schematically illustrates a prior art high thermal resistance semiconductor device.
Figure 1:
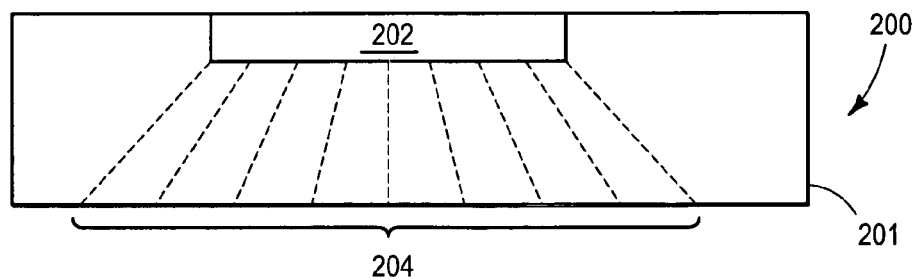

In one example, device 202 of FIG. 1 occupied an area of seven thousand (7000) square mils on the surface of substrate 201. Device 200 had a resulting thermal resistance of about 2.3 degrees C./Watt. For a device 22 having the same area, excluding the area of portion 23, the multiply-connected shape provides device 20 a thermal resistance of about 1.6 degrees C./Watt. This represents a reduction of about 0.7 degrees C./Watt or approximately thirty percent (30%).

Figure 3:
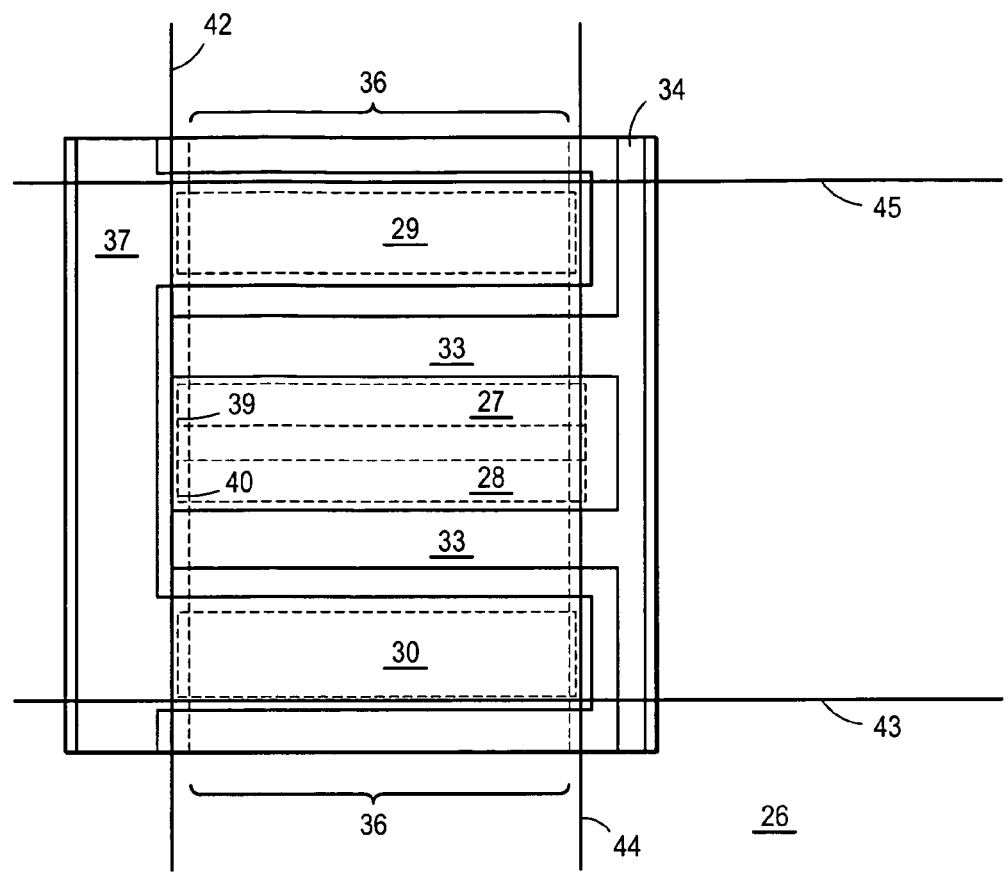
FIG. 3 schematically illustrates a plan view of a portion of an embodiment of a cell of a cell-based semiconductor device in accordance with the present invention.

FIG. 3 schematically illustrates a portion of an embodiment of a transistor cell 26 that is used to form a cell-based lateral MOS power transistor. Transistor cells such as cell 26 typically include a first doped region 30 and a second doped region 29 that are formed on a semiconductor substrate and function as a drain region of transistor cell 26. Additionally, a third doped region 27 and a fourth doped region 28 are formed on the semiconductor substrate and function as sources of cell 26. Regions 27, 28, 29, and 30 are illustrated by dashed lines since they are generally covered by conductors 36 and 37. Gates 33 typically are formed on the surface of the substrate and between regions 27 and 29 and between regions 28 and 30. A gate conductor 34 makes electrical contact to gates 33 and facilitates electrically connecting cell 26 to other adjacent transistor cells that may be formed in a cell-based transistor. Similarly, a drain conductor 37 facilitates electrically connecting regions 29 and 30 together to similar drains in an adjacent transistor cell. A source conductor 36, illustrated by dashed lines, typically extends across cell 26 and makes electrical contact to regions 27 and 28 and facilitates electrically connecting regions 27 and 28 to other similar sources in adjacent transistor cells.

Cell 26 has four (4) sides illustrated as lines 42, 43, 44, and 45. Line 42 is a line that extends along an edge of doped regions 27 and 28 that form the sources and doped regions 29 and 30 that form the drains. Line 42 represents one side of the doped regions within the semiconductor substrate on which cell 26 is formed. Similarly, line 44 extends along an opposite side of regions 27 and 28 and corresponding regions 29 and 30 in a manner similar to line 42. Lines 42 and 44 just barely touch the outermost or distal edges of the doped regions. Line 43 extends along an outside edge of region 30 and forms another side of cell 26. Similarly, line 45 extends along an outside edge of region 29. Lines 42–45 are extended past the boundaries of cell 26 to aid in identifying lines 42–45. For a vertical cell, lines 43 and 45 typically would extend along and just barely touch the outside edge of gates 33. At the least, lines 43 and 45 extend along the portion of cell 26 that dissipates the most power during the operation of cell 26, such as along the channel that is overlying the portion of the drain where the largest current flow occurs.

Transistor cells and corresponding cell-based transistors are well known to those skilled in the art. Examples of transistor cells and corresponding cell-based transistors are disclosed in U.S. Pat. No. 6,566,710 issued to Strachan et al on May 20, 2003, U.S. Pat. No. 6,541,818 issued to Pfirsch on Apr. 1, 2003, U.S. Pat. No. 6,204,533 issued to Williams et al on Mar. 20, 2001, and U.S. Pat. No. 5,034,785 issued to Richard Blanchard on Jul. 23, 1991 which are hereby incorporated herein by reference.

For MOS transistors, the high power dissipation is primarily in the channel region. The channel region typically is the region between the source and drain. Typically, an edge of the source that faces the drain is one edge of the channel and the edge of the drain that faces the source is another edge of the channel. The channel width is at least the width of the narrowest of the edge of the source or drain that faces the channel. Consequently the outside and inside edges of the source or drain can be used to form sides of the cell, thus, sides of the shape that uses the cell. In most cases, this method of finding the sides of the shape is more reliable than using the metal conductors that interconnect the cells together. However, the metal may be used in some cell embodiments. For some closed lateral cells, one edge of the cell may be considered as a line through a source region that is common to two adjacent cells. A typical example of such a cell embodiment is disclosed in U.S. Pat. No. 6,566,710 issued to Strachan et al on May 20, 2003. In other embodiments, cells may be utilized to form a vertical transistor cell that is used in forming vertical cell-based MOS power transistors. For such vertical transistor cells, the drain of regions 29 and 30 typically underlie portions of the sources of respective regions 27 and 28 and also underlie portions of gates 33. Consequently the outside edge of the gate can be used to form the side of the cell, thus, the side of the shape that uses the cell. For some closed vertical cells, the cell may be oriented so that the outside edge of the cell is a point instead of a straight line. A typical example of such a cell embodiment is disclosed in U.S. Pat. No. 6,541,818 issued to Pfirsch on Apr. 1, 2003. For such cells, a line may be drawn to touch the distal points of each outermost cell to form the outside edge of the shape that uses the cell and a similar line may be drawn to connect the distal edge of the innermost cells to form the inside boundary of the shape that uses the cell as will be seen further hereinafter.

As will be understood by those skilled in the art, many various cell implementations are used in the art and many variations are expected in the future as cell designs are modified to provide improved operating parameters such as on-resistance, capacitance, etc. Thus the examples described herein, including the example of cell 26, explaining where the cell boundaries may be defined can vary based on exactly how the cell, thus the shape of the device that uses the cell, is implemented.

Figure 4:
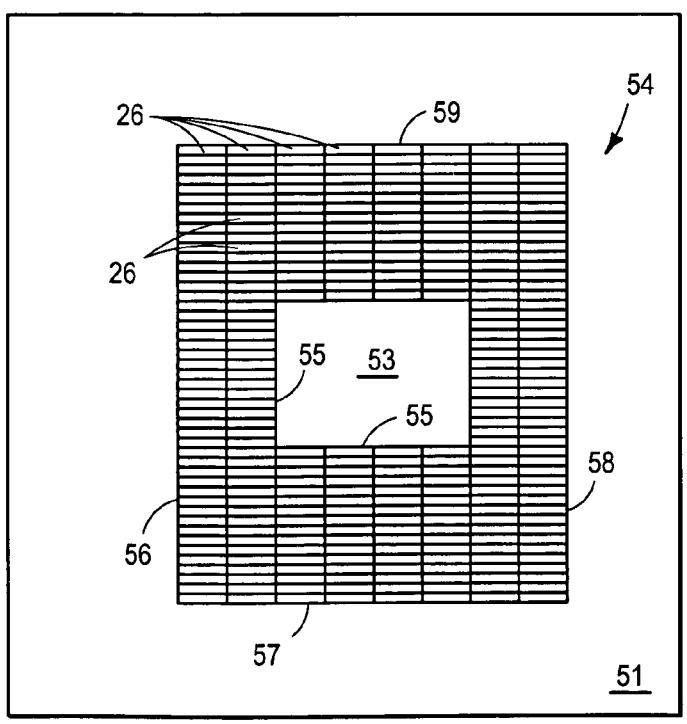
FIG. 4 schematically illustrates a plan view of a portion of an embodiment of another semiconductor device in accordance with the present invention.

FIG. 4 schematically illustrates a plan view of a portion of an embodiment of a semiconductor device 50 that is formed on a semiconductor substrate 51. Device 50 includes a high power dissipating cell-based semiconductor device 54 that is formed from cells such as transistor cell 26 explained in the description of FIG. 3. The shape of device 54 illustrated in FIG. 4 is one example of a shape within the class of shapes that are multiply-connected. The multiply-connected shape provides device 50 improved thermal distribution, minimizes the value of the thermal resistance of device 50, and maximizes the utilization of the area of semiconductor substrate 51. It has been found that the multiply-connected class of shapes or topologies also provides improved power dissipation. Device 54 can be a variety of cell-based semiconductor devices including a vertical MOS power transistor, or a lateral MOS power transistor, or a high current diode or a bipolar transistor. For example, device 54 may be a lateral or vertical LDMOS power transistor. Device 50 may also include other active or passive semiconductor elements that are not shown in FIG. 4 for simplicity of the drawings.

For the example embodiment illustrated in FIG. 4, device 54 is a lateral LDMOS transistor. Such an embodiment of device 54 includes a plurality of cells, such as cell 26, that are positioned on substrate 51 in a square doughnut multiply-connected shape similar to the shape of device 22 that was explained in the description of FIG. 2. Device 54 has a perimeter that includes a first side 56, a second side 57, a third side 58, and a fourth side 59. Side 56 is formed by an outside edge of the doped regions of the current carrying electrodes of the cells along the perimeter of device 54 next to side 56. These doped regions typically form the high power dissipating regions of each cell 26. For the example of a lateral MOS power transistor using cell 26 explained in the description of FIG. 3, during operation the high power dissipation occurs in the channel regions as explained hereinbefore in the description of FIG. 3. Thus, for this example the distal edge of the doped region forming the drain or the source of the outermost cell becomes outside edge or side 56. Correspondingly, the distal edge of the doped region forming the drain or the source of the innermost cell becomes inside edge or side 55.

Device 54 is formed by coupling together the plurality of cells to function substantially in unison to form the functionality for device 54. Side 56 of device 54 could be formed by any of lines 42, 43, 44, or 45 of cells 26 depending on how the cells are positioned within device 54. Similarly sides 57, 58, and 59 of the perimeter of device 54 are also formed by one of lines 42–45 depending on the position of the cells used to form device 54. Outside sides 56–59 of device 54 are arranged to form a perimeter of the shape of device 54. Interior sides 55, similar to sides 25 in FIG. 2, form the interior edges of device 54. The opening or hole of the square doughnut shape exposes a portion 53 of the surface of substrate 51 similar to portion 23 of FIG. 2. The area of device 54 is the area occupied between inside sides 55 and outside sides 56–59. Forming device 54 in the shape of the square doughnut spreads the heat generated by device 54 out across substrate 51, reduces the size of the self-interacting region, and reduces the heat that has to be dissipated at any point of substrate 51 underlying device 54 thereby lowering the thermal resistance of device 50.

For the example of device 202 of FIG. 1 that occupied an area of 7000 square mils as explained in the description of FIG. 2, device 200 had a resulting thermal resistance of about 2.3 degrees C./Watt. For a device 54 having the same area, excluding the area of portion 53, the multiply-connected shape provides device 50 a thermal resistance of about 1.6 degrees C./Watt. This represents a reduction of about 0.7 degrees C./Watt or approximately thirty percent (30%). It should be noted that device 22 of FIG. 2 and device 54 could also be formed to have any other multiply-connected shapes including doughnut shaped polygons such as a quadrilateral, a parallelogram, a trapezoid, a pentagon, hexagon, etc instead of a square doughnut. The other multiply-connected shapes also reduce the thermal resistance of the devices formed in the multiply-connected shape.

Figure 5:
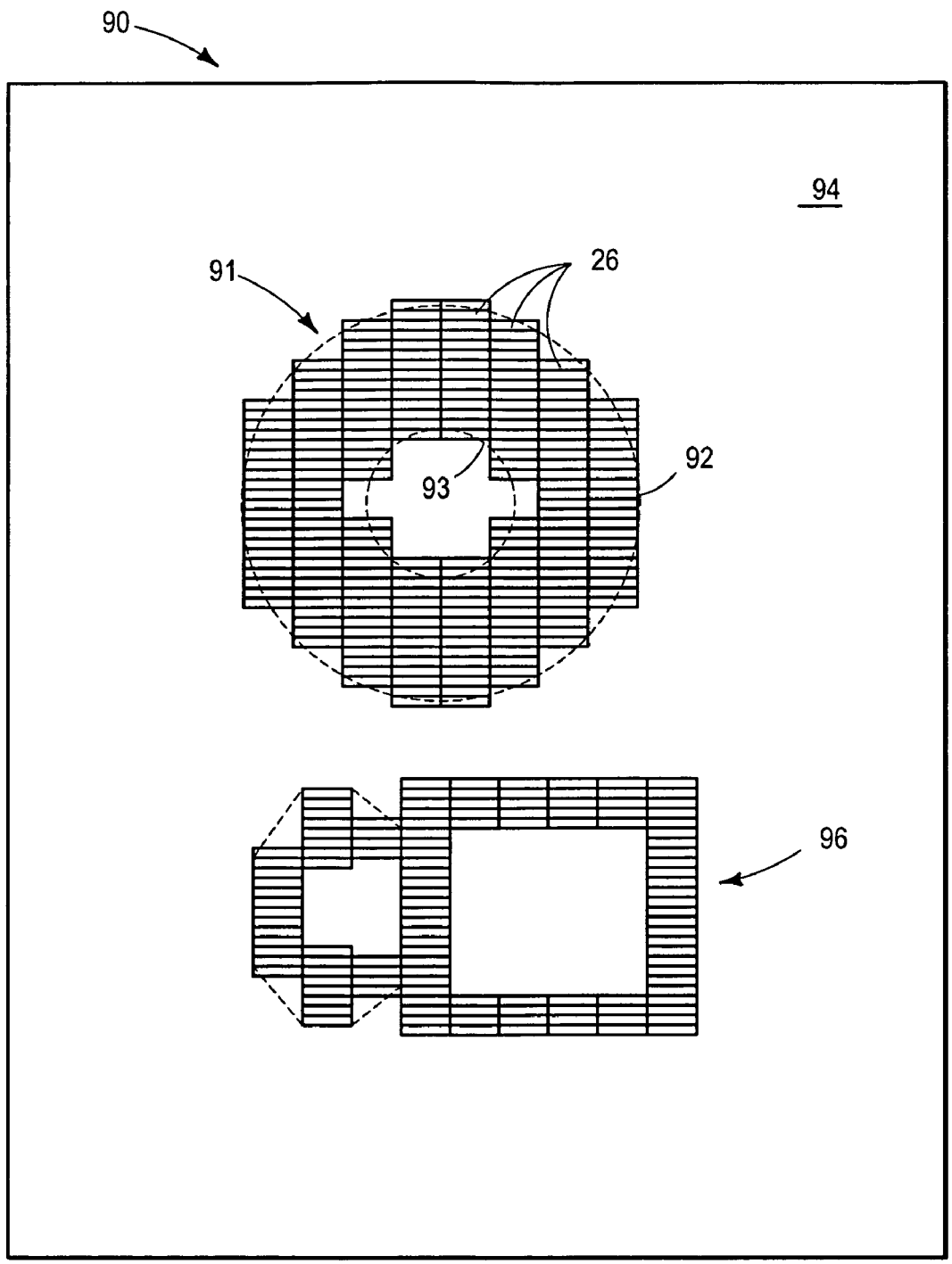
FIG. 5 schematically illustrates a plan view of a portion of a semiconductor device having various embodiments of semiconductor devices in accordance with the present invention.

FIG. 5 schematically illustrates a plan view of a portion of an embodiment of a device 90 that includes devices 91 and 96 that represent some examples of other shapes that are within the class of multiply-connected shapes. Device 90 and devices 91 and 96 are formed on a semiconductor substrate 94. Devices 91 and 96 can be either cell-based or devices having a single body (single body device). Device 91 is formed as a substantially circular doughnut having an outside side 92 that forms the circumference of device 91 and an interior side 93 that forms an interior boundary of device 91. The area of device 91 is the area occupied between sides 92 and 93. If device 91 is formed from a plurality of cells, such as cell 26, the cells typically are positioned so that the outside edges of the cells form side 92 having a shape that is substantially a circle. For the case of device 91 formed as a cell-based device, it will be noticed by those skilled in the art that placing square or rectangular cells 26 will lead to side 92 having a shape that is formed from a multitude of short substantially straight lines formed by the outside edges of cell 26 such as by lines 42–45. However, these large numbers of small straight lines produce a shape that is substantially circular. Similarly, side 93 of device 91 is formed by similar edges of the plurality of cells 26 and is substantially circular. A portion 95 of substrate 94 is exposed within the opening of device 91. Portion 95 may be used in a manner similar to portions 23 (FIG. 2) and 53 (FIG. 4). Device 91 may also have other shapes that are derived from a circle such as an ellipse.

Device 96 is an alternate embodiment of device 91, however, device 96 is formed to have a shape of a figure eight (8) and has two corresponding interior open regions that expose a portion of substrate 94. The outside and inside sides of device 96 have other shapes than a circular doughnut. It should be noted that a shape that is similar to the letter "B" is similar to the figure "8" and is also in this class. Additionally, it should be noted that although the figure "8" and letter "B" shapes have two openings, shapes within this class may have more than two opening.

Figure 6:
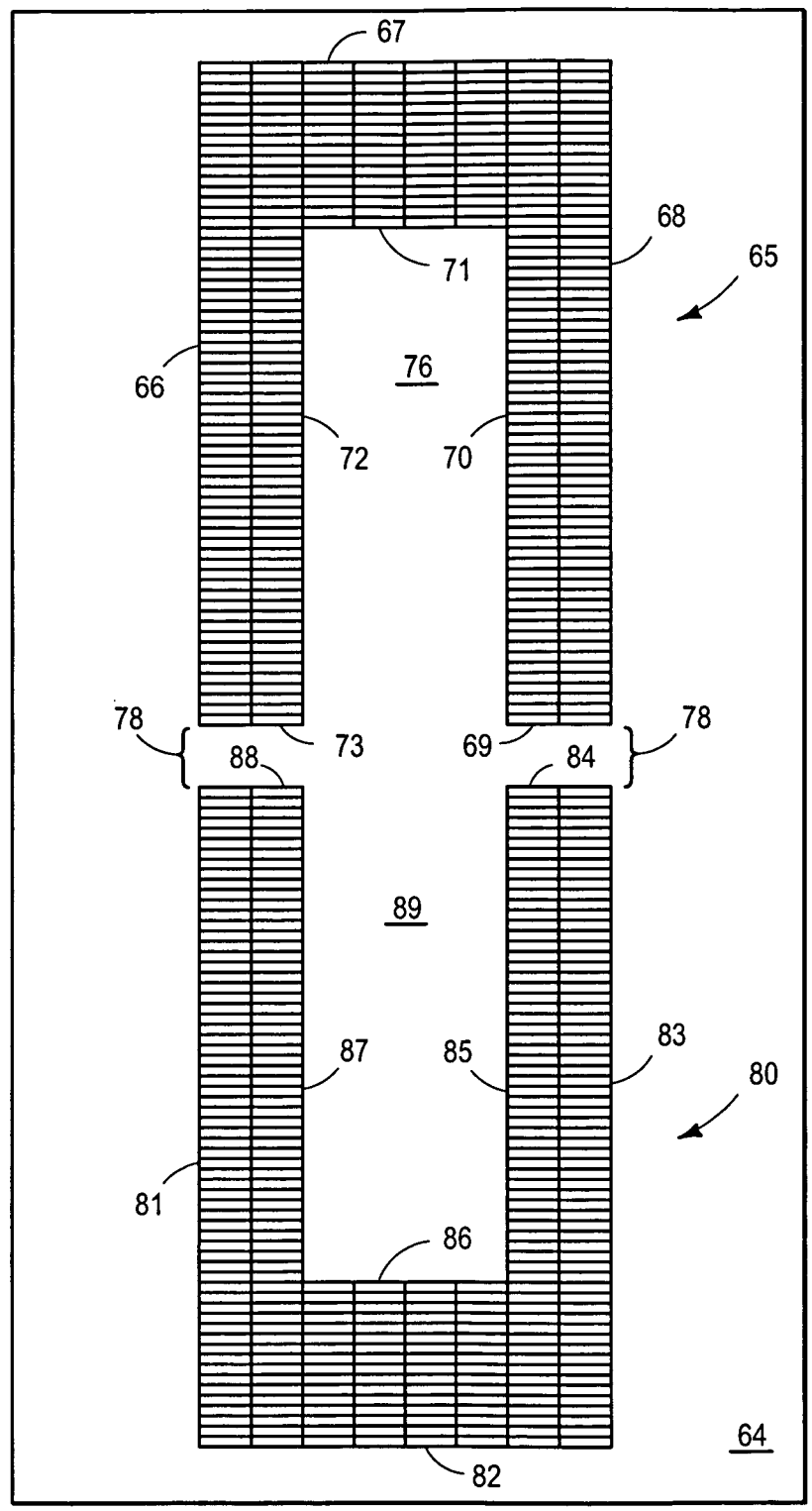
FIG. 6 schematically illustrates a plan view of a portion of an embodiment of still another semiconductor device in accordance with the present invention.

Referring to FIG. 6, it has been found that the class of shapes referred to herein as concave polygons of seven (7) or more sides also provides improved heat distribution that minimizes the value of the thermal resistance of semiconductor devices and that maximizes the utilization of the area of the semiconductor substrate on which the devices are formed. Concave and convex polygons are defined in the book New Plane Geometry, A. M. Welchons and W. R.

Krickenberger, Ginn and Co., 1956, p 169 as "A convex polygon is a polygon having each angle less than a straight angle. A concave polygon is a polygon having at least one angle greater than a straight angle." As used herein this is interpreted to mean that a convex polygon is a polygon having each interior angle less than a straight angle and a concave polygon is a polygon having at least one interior angle greater than a straight angle. FIG. 6 schematically illustrates a plan view of a portion of an embodiment of a semiconductor device 65 and a semiconductor device 80 that are examples of devices formed in an embodiment of an eight (8) sided concave polygon on a semiconductor substrate 64. The eight (8) sided shape of devices 65 and 80 is within the class of shapes referred to herein as concave polygons of seven (7) or more sides. Devices 65 and 80 are formed as high power dissipating cell-based semiconductor devices that utilize transistor cells, such as cell 26 (FIG. 3), to form the shape of the example embodiment of an eight sided concave polygon that has a "U" or horseshoe shape. Devices 65 and 80 can be a variety of high power dissipating semiconductor device such as a vertical power MOS transistor, or a lateral MOS power transistor, or a high current diode. For example, devices 65 and 80 may be cell-based lateral or vertical LDMOS power transistor.

A plurality of cells, such as cell 26, are positioned to form device 65 with a perimeter having sides 66, 67, 68, 69, 70, 71, 72, and 73 that are formed by the outside edges of the cells. For example, the plurality of cells may be positioned so that a line, such as line 42, of the outside row of cells forms side 66 and so that a line, such as line 44, of an outside edge of an adjacent row of cells form side 72 while side 73 is formed by the sides of cells that form a line such as line 43. Correspondingly, sides 68, 69, and 70 would be formed by corresponding lines 44, 43, and 42 while sides 67 and 71 would be formed by corresponding lines 45 and 43. Between sides 70 and 72, device 65 is open and exposes a portion 76 of underlying substrate 64. Thus, the heat generated by device 65 is spread out over a greater area of substrate 64 and is not concentrated all in one small localized area, and the thermal resistance is reduced similarly to that described for devices 20 and 50. Additionally, portion 76 can be utilized to form other smaller devices such as logic and transistor drivers thereby keeping the packing density of device 65 substantially constant. Device 80 is formed similar to device 65. Device 80 includes sides 81, 82, 83, 84, 85, 86, 87, and 88 that are formed in a manner similar to corresponding sides 68, 67, 66, 73, 72, 71, 70, and 69 of device 65. Additionally, a portion 89 of substrate 64 that is similar to portion 76 is exposed between sides 85 and 87. Devices 65 and 80 are separated by a space 78. Space 78 may be used to route conductors used to interconnect devices 65 and 80 together so that devices 65 and 80 form one cell-based device where all of the cells function together as one device such as a single lateral LDMOS power transistor. Alternately devices 65 and 80 may not be electrically connected together in such a manner and may be connected to function as two separate cell-based devices such as two separate lateral LDMOS power transistors. Those skilled in the art realize that cell 26 is one example of cells that may be used to form devices having shapes in this category of concave polygons of seven (7) or more sides and that other cells, such as those explained in the description of FIG. 3, may be used.

Figure 7:
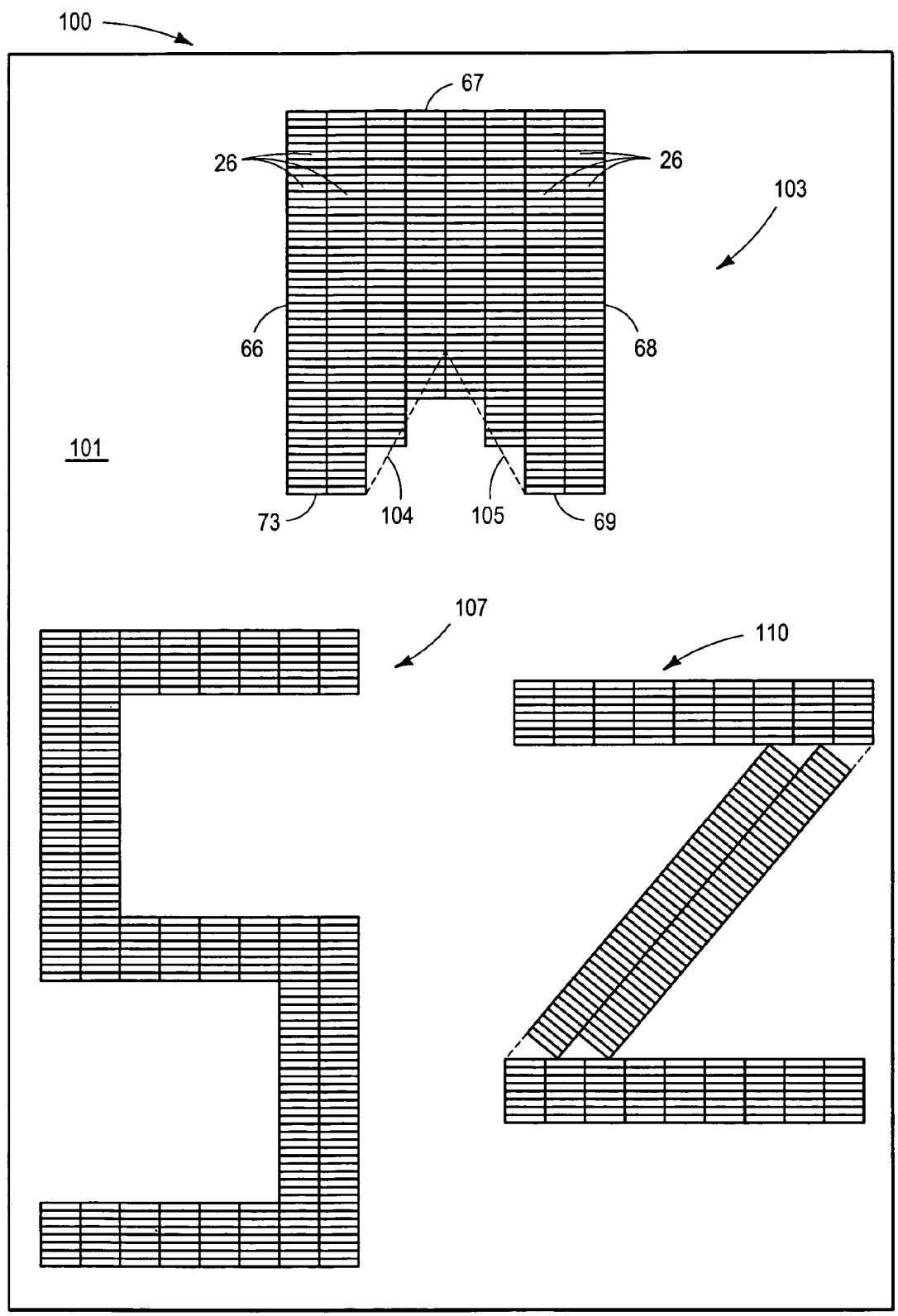
FIG. 7 schematically illustrates a plan view of a portion of another semiconductor device having various other embodiments of semiconductor devices in accordance with the present invention.

Referring to FIG. 7, the class of shapes of concave polygons having seven (7) or more sides includes a variety of other shapes. FIG. 7 illustrates a device 100 that includes devices 103, 107, and 110 that are formed on a semiconductor substrate 101. Device 103, 107, and 110 illustrate some examples of devices formed with other shapes that are within this class. Device 103 has a shape of a seven sided concave polygon. Device 103 is an alternate embodiment of device 65 that was explained in the description of FIG. 2. Device 103 has interior sides 104 and 105 that extend at an angle from respective sides 69 and 73 to meet at approximately a point. For the example of device 103 formed from a plurality of cells, those skilled in the art realize that sides 104 and 105 may not be perfectly straight lines but may be a jagged line that is representative of a straight line and that the point of intersection may be extended from the sides of cells at the end of lines that represent sides 104 and 105. It should be noticed that shape 103 is similar to a letter "V" shape and that a letter "V" shape is within this class. Additionally, a shape similar to the letter "E" is also within this class.

Device 107 is formed in the shape of an "S" and device 110 is formed in the shape of a "Z" similarly to device 65 and 103.

Figure 8:
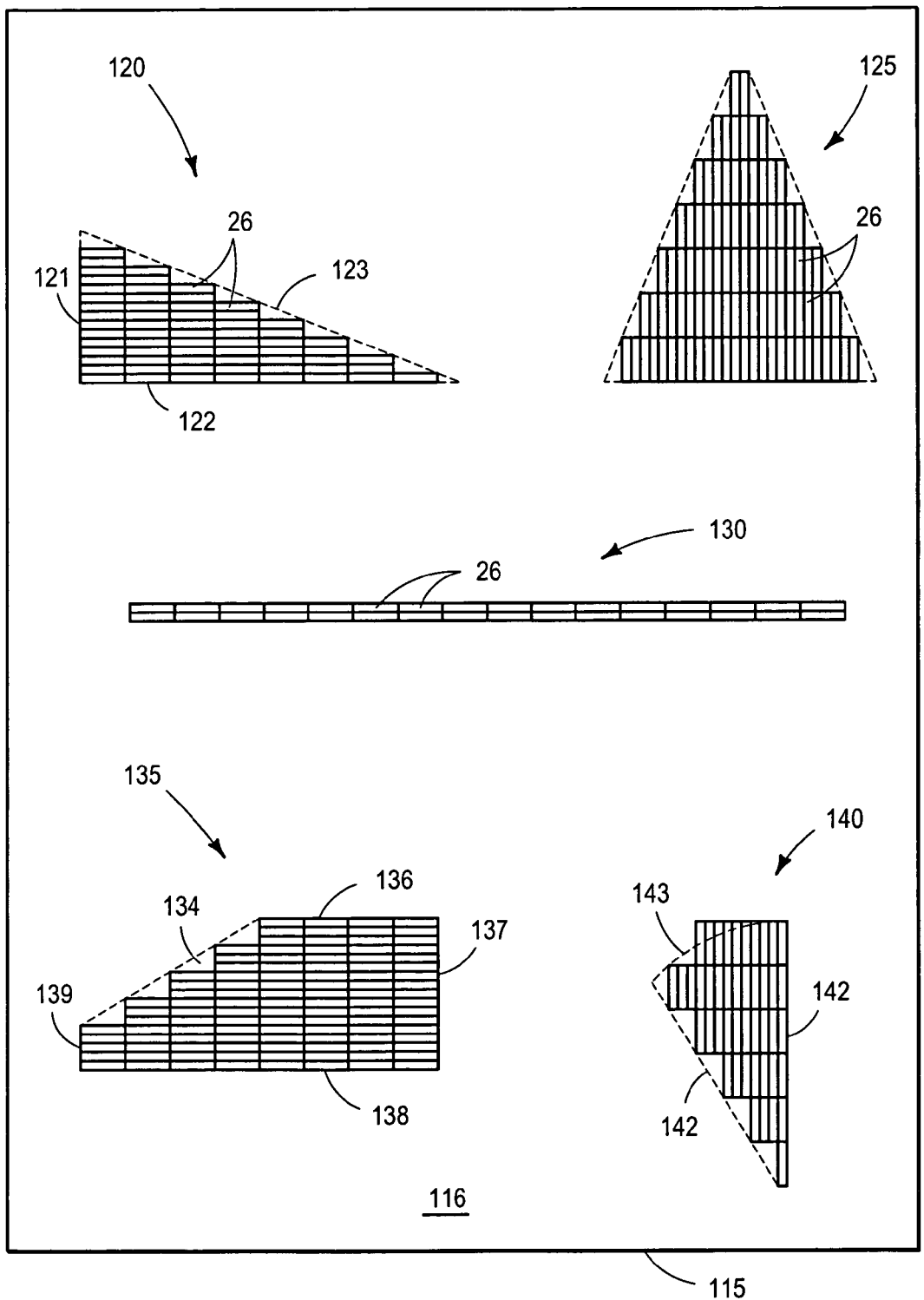
FIG. 8 schematically illustrates a plan view of a portion of another semiconductor device having various other embodiments of semiconductor devices in accordance with the present invention.

FIG. 8 schematically illustrates a semiconductor device 115 that includes semiconductor devices 120, 125, 130, 135, and 140 that are formed on a semiconductor substrate 116. Devices 120, 125, 130, 135, and 140 are formed in various shapes or topologies that are examples of other classes of shapes or topologies that can be used for semiconductor devices in order to improve thermal distribution, to minimize the value of the thermal resistance of the devices, and to maximize the utilization of the area of semiconductor substrate on which the devices are formed.

One class of shapes is three-sided polygons that have a perimeter ratio that is no less than about 1.6. As used herein, the perimeter ratio of a shape is the ratio between the length of the perimeter of the shape and the length of the circumference of an equivalent circle having an area that is equal to the area of the shape. Another way of expressing the perimeter ratio is a shape with a perimeter length that is at least N times greater than the length of the circumference of an equivalent circle that has the same area as the area of the shape. For the class of three-sided polygons that have a perimeter ratio that is no less than about 1.6, N is about 1.6. For other perimeter ratios for other classes, N may be different. For example, device 120 has a shape of a triangle and has a perimeter ratio no less than 1.6. Device 120 has sides 121, 122, and 123 and can be cell-based or non-cell-based. For example, if side 121 is about one unit and side 122 is about three units then side 123 is about 3.162 units. Thus, the perimeter of device 120 is about 7.162 units and the area is about 1.5 units. The equivalent circle has the same area as device 120 and has a circumference of about 4.342 units. The resulting perimeter ratio is about 1.65 (7.162/4.342). Thus, the perimeter of 7.162 units is greater than 1.6 times the 4.342 unit perimeter of the equivalent circle. Another example of a device with a shape that is within this class is device 125 that has a shape of an isosceles triangle that provides a perimeter ratio of no less than 1.6.

Another class is four-sided polygons that have a perimeter ratio that is no less than about 2.5. An example of such a shape is device 130 that has a shape of a long narrow quadrilateral. In one example embodiment, a device 130 has a width or height of about one unit and a length of about 17.6 units. The resulting perimeter is about 37.2 units and the area is about 17.6 units. The equivalent circle of the same area has a circumference of about 14.872 units. Thus the perimeter ratio of the exemplary device 130 is about 2.501 (37.2 divided by 14.872).

Still another class is five-sided polygons that have a perimeter ratio that is no less than about 1.5. An example of such a shape is illustrated by device 135. Device 135 has sides 134, and 136–139. In one example embodiment, a device 135 has sides 136–139 and 134 that are respectively about 8.0 units, 2.0 units, 10.0 units, 1.0 unit, and 2.236 units. The resulting perimeter is about 23.236 units and the area is about 19.0 units. The equivalent circle of the same area has a circumference of about 15.451 units. Thus the perimeter ratio of the exemplary device 135 is about 1.504 (23.236 divided by 15.451).

A further class is shapes having a perimeter with at least one curved side and having a perimeter ratio that is no less than about 1.5. An example of such a shape is a pie or wedge as illustrated by device 140. Device 140 has a wedge shape with straight sides 142 and a curved side 143. In one example embodiment, a device 140 has sides 142 that form an angle of about twenty three (23) degrees at the point of intersection and have a length of about one unit. The resulting perimeter is about 2.401 units and the area is about 0.201 units. The equivalent circle of the same area has a circumference of about 1.588 units. Thus the perimeter ratio of the exemplary device 140 is about 1.512.

Figure 9:
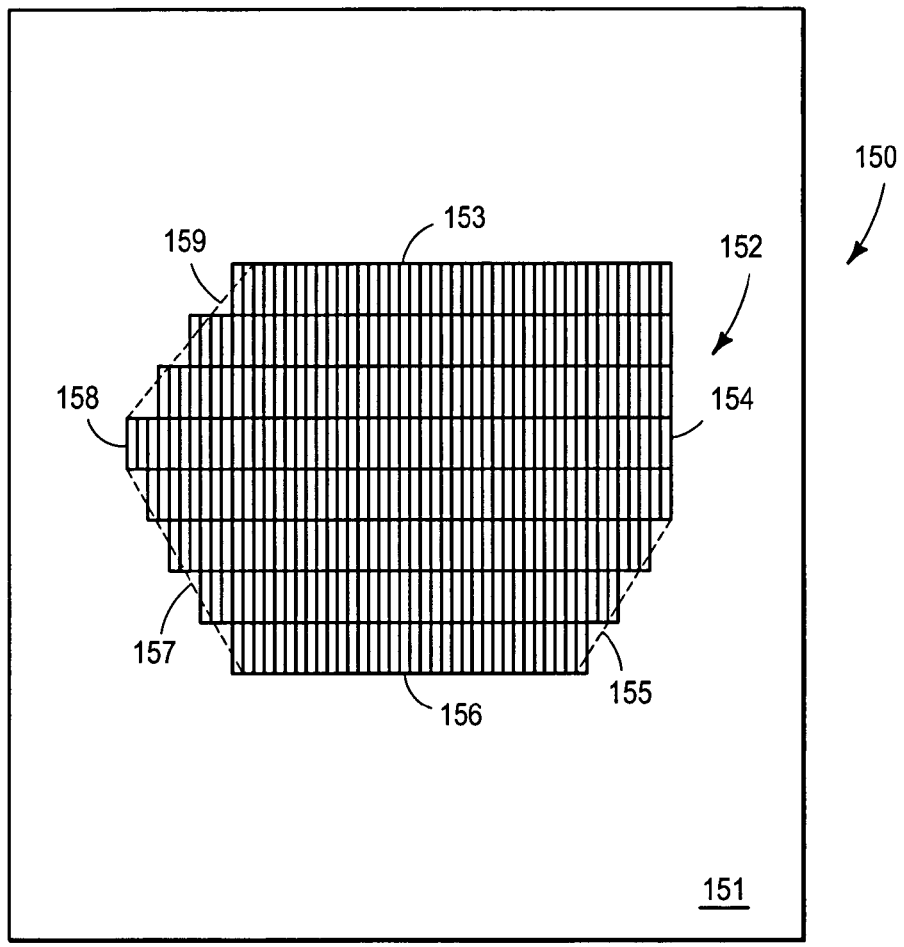
FIG. 9 schematically illustrates a plan view of a portion of yet another semiconductor device having various other embodiments of semiconductor devices in accordance with the present invention.

Referring to FIG. 9, convex polygons having seven or more sides and a perimeter ratio of no less than about 1.5 is another class of shapes that reduce the size of the self-interaction region of the device. A device 150 is formed on a semiconductor substrate 151 and includes a device 151. Device 151 has sides 153–159 and is an example of a shape that is within the class of polygons having seven or more sides and a perimeter ratio of no less than about 1.5. In one example, device 152 has side 158 that is one unit, side 157 that is 2.236 units, side 156 that is twelve units, side 155 that is 2.236 units, side 154 that is two units, side 153 that is fourteen units, and side 159 that is 2.236 units. The resulting perimeter is about 35.708 units and the area is about forty five (45) units. The equivalent circle of the same area has a circumference of about 23.78 units. Thus the perimeter ratio of the exemplary device 152 is about 1.502 units.

The sides of devices 120, 125, 135, 140 and 152 are illustrated as straight lines. Also, the sides of device 96 in FIG. 5, and the sides of devices 100, 107, and 110 in FIG. 7 are illustrated as straight lines. However, for the case where devices 96, 100, 107, 110, 120, 125, 135, 140, and 152 are cell-based devices it will be noticed by those skilled in the art that placing square or rectangular cells 26 may lead to sides 121–123 of device 120 and the sides of devices 96, 100, 107, 110, 120, 125, 135, 140 and 152 having a shape that is formed from a multitude of short substantially straight lines formed by the outside edges of the plurality of cells 26 such as by lines 42–45. However, these large numbers of small straight lines produce a perimeter that has a shape that is substantially the described three-sided or five-sided shape. The lines formed by the sides typically will not be straight lines but will be jagged as the straight sides of the plurality of cells 26 are combined to form the sides of the perimeter of the devices. Additionally, there may be no cells at or near the apex of the three-sided or five-sided shapes and the sides may have to be projected past the last cell in order to illustrate the apex as illustrated by the dashed portion of the lines illustrating the sides of devices 120, 125, and 135. It should also be noted that the jagged edges of cell based shapes 96, 100, 107, 110, 120, 125, 135, 140 and 152 also fall into the class of concave polygons having seven or more sides.

In view of all of the above, it is evident that a novel device and method is disclosed. Included, among other features, is forming a device to have certain shapes or topologies that provide improved thermal distribution and a reduced thermal resistance. The open areas within some of the classes of devices provide an area to form other active and passive elements thereby preventing the enlarged size of the devices from reducing the packing density.

While the invention is described with specific preferred embodiments, it is evident that many alternatives and variations will be apparent to those skilled in the semiconductor arts.

The invention claimed is:

1. A method of forming a semiconductor device comprising:
   forming doped regions of the semiconductor device in a device shape having a first perimeter that has a first length on a surface of a semiconductor substrate and having a first area; and
   arranging the doped regions to form the device shape that is selected from the group consisting of a shape that is a three sided polygon wherein the first length is no less than 1.6 times a first distance around a circumference of a circle having the first area, a four sided polygon wherein the first length is no less than 2.5 times the first distance, a five sided polygon wherein the first length is no less than 1.5 times the first distance, a shape wherein at least one side is curved and the first length is no less than 1.5 times the first distance, and a convex polygon of seven or more sides wherein the first length is no less than 1.5 times the first distance.

2. The method of claim 1 wherein forming doped regions of the semiconductor device in the device shape having the first perimeter that has the first length on the surface of the semiconductor substrate and having the first area includes coupling together a plurality of cells to function substantially in unison to form a functionality for the semiconductor device.

3. The method of claim 2 wherein coupling together the plurality of cells to function substantially in unison includes coupling together the plurality of cells to function substantially in unison wherein a line connecting an outer side of doped regions of the plurality of cells forms the device shape.

4. The method of claim 2 wherein coupling together the plurality of cells to function substantially in unison to form the functionality for the semiconductor device includes coupling together the plurality of cells wherein each cell has a first current carrying electrode and a second current carrying electrode wherein all first current carrying electrodes are commonly connected together and all second current carrying electrodes are commonly connected together.

5. The method of claim 2 further including each cell having a control electrode wherein all control electrodes are commonly connected together.

6. The method of claim 1 wherein forming doped regions of the semiconductor device in the device shape having the first perimeter that has the first length on the surface of the semiconductor substrate and having the first area includes coupling together a plurality of cells wherein a line intersecting a distal edge of doped regions of a current carrying electrode of the plurality cells forms at least one side of the first perimeter.

7. The method of claim 1 wherein arranging the doped regions to form the device shape includes arranging the doped regions to form the shape selected from the group consisting of a B shape having at least one substantially curved side, a wedge, and a long narrow quadrilateral.

8. The method of claim 1 wherein forming the doped regions of the semiconductor device includes forming the doped regions of one of a lateral power transistor or a vertical power transistor.

9. The method of claim 1 wherein arranging the doped regions includes arranging a source region or a drain region wherein one side of the source region or the drain region forms a side of the first perimeter.

10. A method of improving the thermal dissipation of a semiconductor device comprising:

arranging doped regions of the semiconductor device to form a device shape having a first perimeter having a first length and a first area wherein the device shape is selected from the group consisting of a three sided polygon wherein the first length is no less than 1.6 times a first distance around a circumference of a circle having the first area, a four sided polygon wherein the first length is no less than 2.5 times the first distance, a five sided polygon wherein the first length is no less than 1.5 times the first distance, a shape wherein at least one side is curved and the first length is no less than 1.5 times the first distance, and a convex polygon of seven or more sides wherein the first length is no less than 1.5 times the first distance.

11. The method of claim 10 wherein arranging the doped regions includes arranging a plurality of device cells to form the device shape.

12. The method of claim 10 wherein arranging the doped regions includes arranging the doped regions of the semiconductor device to form the device shape that is one of a B shape having at least one substantially curved side, a wedge, or a long narrow quadrilateral.

13. A semiconductor device comprising:

a device shape having a first perimeter having a first length and a first area wherein the device shape is selected from the group consisting of a three sided polygon wherein the first length is no less than 1.6 times a first distance around a circumference of a circle having the first area, a four sided polygon wherein the first length is no less than 2.5 times the first distance, a five sided polygon wherein the first length is no less than 1.5 times the first distance, a shape wherein at least one side is curved and the first length is no less than 1.5 times the first distance, and a convex polygon of seven or more sides wherein the first length is no less than 1.5 times the first distance.

14. The semiconductor device of claim 13 wherein the device shape includes a plurality of cells operably coupled to function substantially in unison to form a functionality for the semiconductor device.

15. The semiconductor device of claim 14 wherein outer sides of doped regions of the plurality of cells form the device shape.

16. The semiconductor device of claim 13 further including a line intersecting a distal edge of doped regions of a current carrying electrode of the semiconductor device forming at least one side of the first perimeter.

17. The semiconductor device of claim 13 wherein the semiconductor device is one of a lateral transistor or a vertical transistor.

18. The semiconductor device of claim 13 wherein the device shape is one of a B shape having at least one substantially curved side, a wedge, or a long narrow quadrilateral.

* * * * *